US009519738B2

(12) United States Patent
Cooke et al.

(10) Patent No.: US 9,519,738 B2
(45) Date of Patent: Dec. 13, 2016

(54) SELECTIVELY TUNING FREQUENCY MODES OF A STRUCTURE

(71) Applicant: LENOVO ENTERPRISE SOLUTIONS (SINGAPORE) PTE. LTD., Singapore (SG)

(72) Inventors: James A. Cooke, Cary, NC (US);
Kenton C. Green, Cary, NC (US);
Michael S. Green, Concord, NC (US);
Matthew L. Nickerson, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 669 days.

(21) Appl. No.: 13/804,610

(22) Filed: Mar. 14, 2013

(65) Prior Publication Data

US 2014/0278288 A1    Sep. 18, 2014

Related U.S. Application Data (63) Continuation of application No. 13/801,863, filed on Mar. 13, 2013.

(51) Int. Cl.
*G06F 17/50*    (2006.01)

(52) U.S. Cl.
CPC .................. *G06F 17/5018* (2013.01)

(58) Field of Classification Search
CPC .................................................. G06F 17/5018
USPC ............................................................ 703/1
See application file for complete search history.

(56) References Cited

U.S. PATENT DOCUMENTS

| 2004/0156515 A1 | 8/2004 | Harris et al. |
| 2005/0194210 A1* | 9/2005 | Panossian ............... B32B 3/12 181/293 |
| 2006/0195307 A1 | 8/2006 | Huang et al. |

OTHER PUBLICATIONS

New Maya Plugin—Structure analysis with Maya, CS-FEM, Sep. 20, 2005.*

* cited by examiner

*Primary Examiner* — Aniss Chad
(74) *Attorney, Agent, or Firm* — Brandon C. Kennedy; Katherine S. Brown; Kennedy Lenart Spraggins LLP (57) ABSTRACT

Selectively tuning frequency modes of a structure, including: identifying, by a finite element analysis module, a plurality of frequency modes of the structure; and selectively altering, by the finite element analysis module, a target frequency mode a greater amount than the other frequency modes of the structure, including modifying a local attribute of a portion of the structure associated with the target frequency mode without modifying the attribute over the entire structure.

15 Claims, 4 Drawing Sheets

SELECTIVELY TUNING FREQUENCY MODES OF A STRUCTURE

CROSS-REFERENCE TO RELATED APPLICATION

This application is a continuation application of and claims priority from U.S. patent application Ser. No. 13/801,863, filed on Mar. 13, 2013.

BACKGROUND OF THE INVENTION

Field of the Invention

The field of the invention is data processing, or, more specifically, methods, apparatus, and products for selectively tuning frequency modes of a structure.

Description of Related Art

Advanced numerical analysis of product designs has become a critical part of product development and aids by allowing product characteristics such as stress, vibration, shock, cooling, and other risks to be analyzed before any prototype parts are made. The net result is faster development, fewer design defects, and the opportunity for numerical optimization of the product before any prototypes are even built. Most Finite Element Analysis vendors offer vibration mode optimization software, which will allow the user to specify a target frequency for a specific vibration mode of the structure and a design parameter such as thickness that can be varied to achieve the vibration frequency target. The program will iterate the finite element model by varying the design parameter in each run until the frequency target is achieved.

While this is very helpful for many problems, complex real world structures such as hard disk drives, airplanes, ships, and buildings have several vibration modes for each part which may result in dozens of modes in the final assembly. The designer will try to avoid having two vibration modes (in two different parts) at the same frequency since they will amplify each other's motion and degrade the function or reliability of the product. Typically, one or two of the modes may not be a problem, but the third mode might be at the same frequency of a vibration mode in another part, causing serious functional issues. Current optimization software, such as that described above, changes global parameters such as thickness of an entire structure. In doing so, all three modes will change simultaneously as a result of the global parameter change. While solving one problem, the optimization may create a new problem at another frequency. What is needed, therefore, is an optimization process that enables selective tuning of frequency modes.

SUMMARY OF THE INVENTION

Methods, apparatus, and products for selectively tuning frequency modes of a structure are described in this specification. Selectively tuning frequency modes of a structure may include identifying, by a finite element analysis module, a plurality of frequency modes of the structure; and selectively altering, by the finite element analysis module, a target frequency mode a greater amount than the other frequency modes of the structure, including modifying a local attribute of a portion of the structure associated with the target frequency mode without modifying the attribute over the entire structure.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
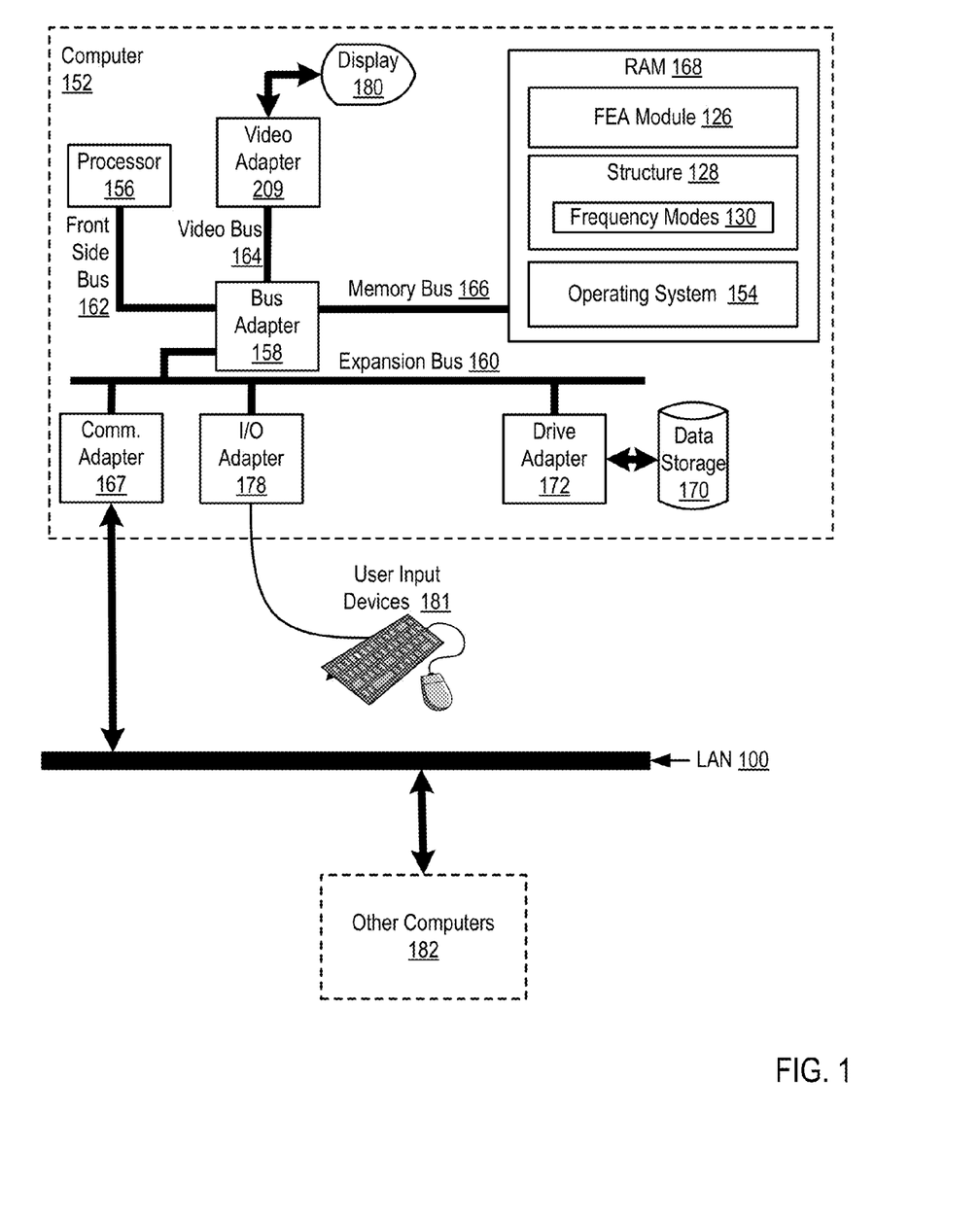
FIG. 1 sets forth a block diagram of a system for selectively tuning frequency modes of a structure according to embodiments of the present invention.

Exemplary methods, apparatus, and products for selectively tuning frequency modes of a structure in accordance with the present invention are described with reference to the accompanying drawings, beginning with FIG. 1. FIG. 1 sets forth a block diagram of a system for selectively tuning frequency modes of a structure according to embodiments of the present invention. The term 'frequency mode' refers to a response by a structure when resonating at a particular frequency. Each frequency mode is characterized by a center frequency and some bandwidth of frequencies surrounding the center frequency. Vibration of a structure, for example, may cause greater resonation at different frequencies. The term 'structure' as used in this specification refers to any type of structure which may be analyzed with finite element analysis techniques. Some examples of structures may include portions of a hard disk drive, portions of airplanes, vehicles, ships, and buildings.

The system of FIG. 1 includes an example of automated computing machinery comprising a computer (152). The computer (152) of FIG. 1 includes at least one computer processor (156) or 'CPU' as well as random access memory (168) (RAM') which is connected through a high speed memory bus (166) and bus adapter (158) to processor (156) and to other components of the computer (152).

Stored in RAM (168) is a finite element analysis module (126), a module of computer program instructions for selectively tuning frequency modes of a structure according to embodiments of the present invention. The finite element analysis (FEA) module may, in some embodiments, be a FEA application or a plug-in for such an application. The FEA module (126) may be configured for selectively tuning frequency modes of a structure according to embodiments of the present invention by identifying a plurality of frequency modes (130) of the structure (128) and selectively altering a target frequency mode a greater amount than the other frequency modes of the structure. The term 'target frequency mode' is a frequency mode which a user or the FEA module intends to alter in terms of center frequency. Consider, for example, that one structure of an apparatus has a three frequency modes: one mode at 100 HZ, one mode at 500 HZ, and one mode at 1 KHZ. Consider also that a second structure in the apparatus includes at least one mode that is centered at 1 KHZ. Because each structure includes a frequency mode at 1 KHZ, the two modes will amplify one another which may, over time, cause degradation or failure of one or both structures. As such, a user may target one of the 1 KHZ modes to vary or alter. In such an example, the user may target the 1 KHZ mode of the first structure, preferring to move the center frequency of the mode to 800 HZ, where no other mode currently exists in either structure.

In the example of FIG. 1, the FEA module (126) may alter a target frequency mode by modifying a local attribute of a portion of the structure associated with the target frequency mode without modifying the attribute over the entire structure. A 'local attribute' is a contrast to a global attribute. A local attribute refers to an attribute a particular location of the structure while a global attribute is an attribute of the entire structure. Consider, for example, an attribute of thickness on a structure comprising a steel rod. Altering the global thickness attribute of such a steel rod by increasing the diameter results in increasing thickness along the entire steel rod. By contrast, altering a local thickness attribute of the steel rod may be localized to changing the diameter of only a portion of the rod—say, one tenth of the rod at a one end of the rod.

Also stored in RAM (168) is an operating system (154). Operating systems useful selectively tuning frequency modes of a structure according to embodiments of the present invention include UNIX™, Linux™, Microsoft XP™, AIX™, IBM's i5/OS™, and others as will occur to those of skill in the art. The operating system (154), FEA module (126) and structure (128) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for selectively tuning frequency modes of a structure according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for selectively tuning frequency modes of a structure according to embodiments of the present invention include modems for wired dial-up communications, Ethernet (IEEE 802.3) adapters for wired data communications, and 802.11 adapters for wireless data communications.

The arrangement of servers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
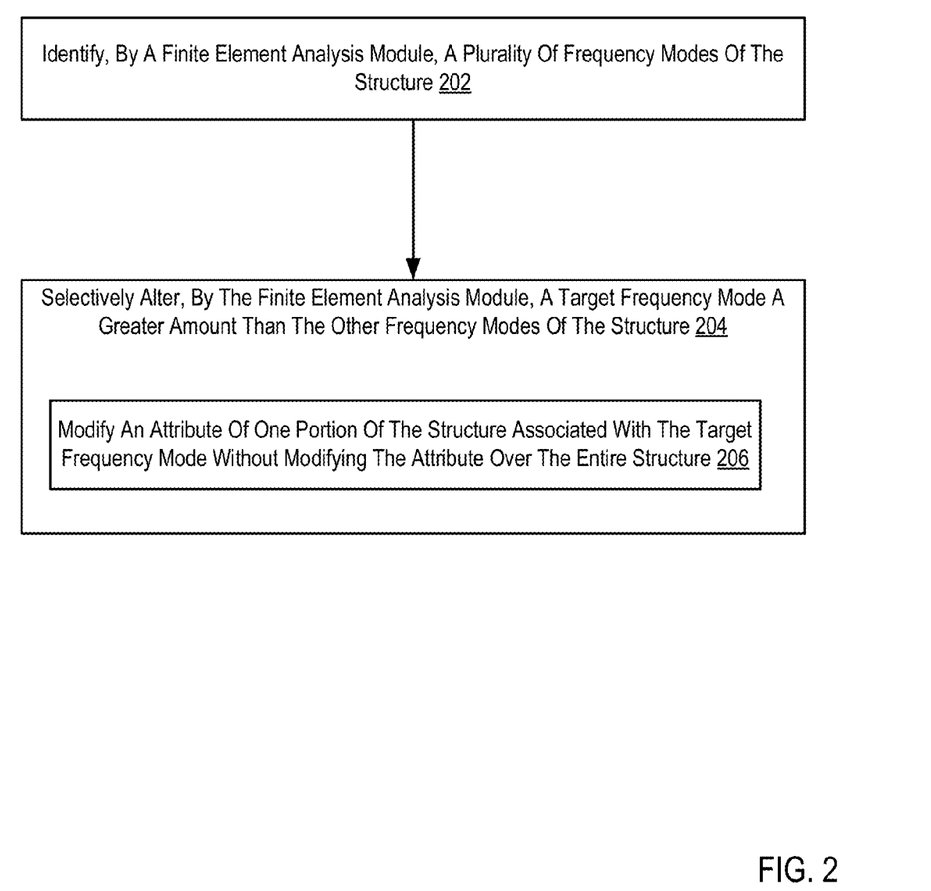
FIG. 2 sets forth a flow chart illustrating an exemplary method for selectively tuning frequency modes of a structure according to embodiments of the present invention.

For further explanation, FIG. 2 sets forth a flow chart illustrating an exemplary method for selectively tuning frequency modes of a structure according to embodiments of the present invention. The method of FIG. 2 includes identifying (202), by a finite element analysis module, a plurality of frequency modes of the structure. Once identified, the method of FIG. 2 continues by selectively altering (204), by the finite element analysis module, a target frequency mode a greater amount than the other frequency modes of the structure. Here, the target frequency mode is said to be altered a greater amount than the other frequency modes in that the other frequency modes will be changed very little, if any. It is noted that any alteration of a structure will necessarily affect all frequency modes, but with local attribute modification as described below, one frequency mode (the target) will be altered significantly more than the others. So significantly more, in fact, that the other frequency modes can be thought of as not being altered at all.

In the example of FIG. 2, selectively altering (204) the target frequency mode includes modifying (206) a local attribute of a portion of the structure associated with the target frequency mode without modifying the attribute over the entire structure. Modifying (206) a local attribute of a portion of the structure associated with the target frequency mode without modifying the attribute over the entire structure may be carried out in various ways. Some of those ways are set forth below with respect to FIG. 3 and FIG. 4.

Figure 3:
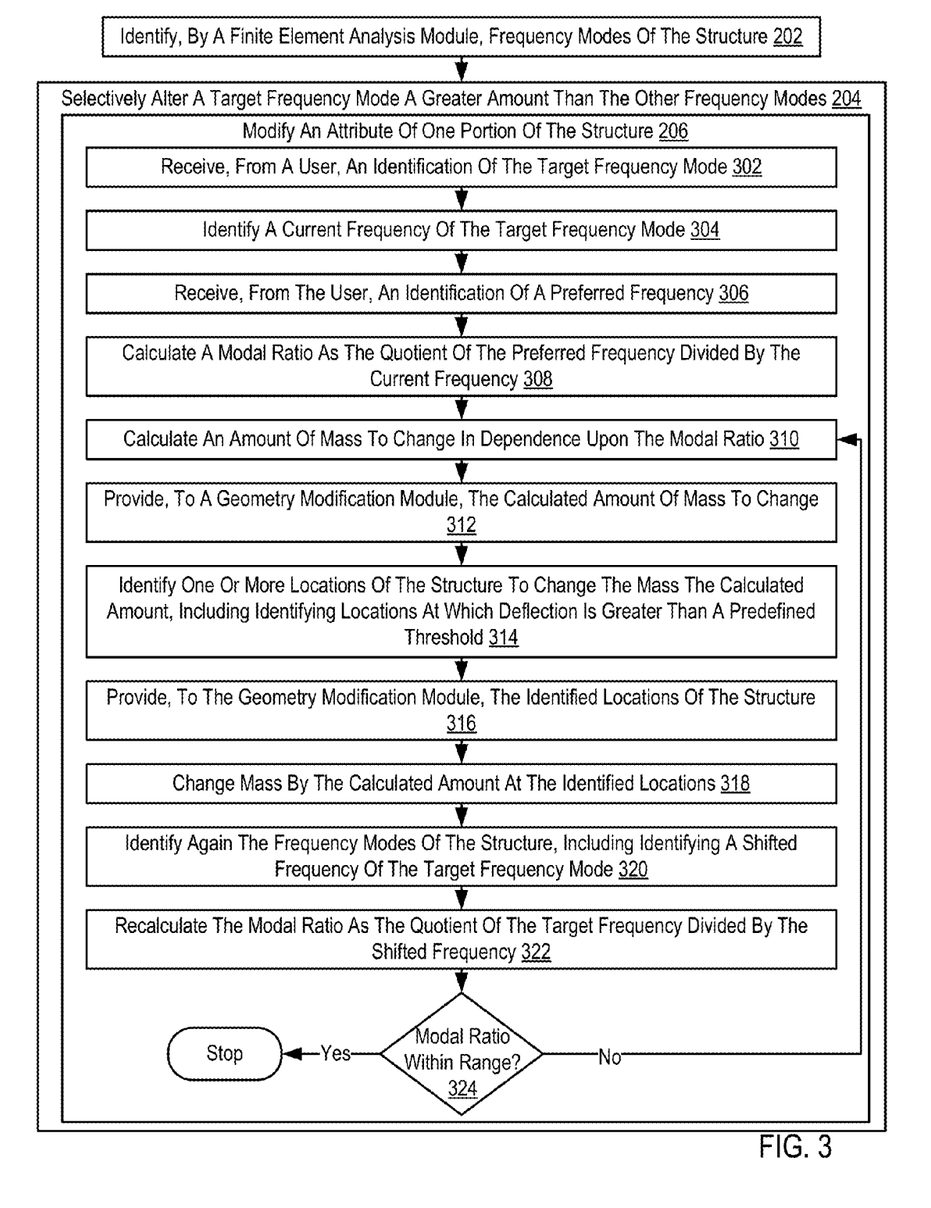
FIG. 3 sets forth a flow chart illustrating another exemplary method for selectively tuning frequency modes of a structure according to embodiments of the present invention.

For further explanation, therefore, FIG. 3 sets forth a flow chart illustrating another exemplary method for selectively tuning frequency modes of a structure according to embodiments of the present invention. The method of FIG. 3 is similar to the method of FIG. 2, including as it does, identifying (202) frequency modes of the structure and selectively altering (204) the target frequency mode, including modifying (206) a local attribute of a portion of the structure associated with the target frequency mode without modifying the attribute over the entire structure. The method of FIG. 3, however, differs from the method of FIG. 2 in that in the method of FIG. 3, modifying (206) a local attribute of a portion of the structure associated with the target frequency mode includes a method of localized mass modification. More specifically, the method of FIG. 3 includes receiving (302), from a user, an identification of the target frequency mode. The FEA module may provide a user interface through which a user may provide a selection or other identification of the target frequency mode.

The method of FIG. 3 also includes identifying (304) a current frequency of the target frequency mode and receiving (306), from the user, an identification of a preferred frequency of the target frequency mode.

The method of FIG. 3 continues by calculating (308) a modal ratio as the quotient of the preferred frequency divided by the current frequency. Once calculated, the method continues by calculating (310) an amount of mass to change in dependence upon the modal ratio. The term 'change' here may mean either increase or decrease. Calculating (310) an amount of mass to change in dependence upon the modal ratio may include calculating the amount of mass to change as Current Mass/Modal Ratio^2, where "Current Mass" is the mass at a location of the structure at which deflection is greater than a predefined threshold (such as 90% of the maximum deflection) when operating at the target frequency mode.

The method of FIG. 3 also includes providing (312), to a geometry modification module, the calculated amount of mass to change. A geometry modification module is a module of computer program instructions that carries out geometry modifications (modifying mass or stiffness, for example) of a structure under FEA.

The method of FIG. 3 also includes identifying (314) one or more locations of the structure to change the mass the calculated amount. In the method of FIG. 3, identifying (314) locations of the structure to change the mass may be carried out by identifying locations at which deflection is greater than a predefined threshold when operating at the target frequency mode.

The method of FIG. 3 continues by providing (316), to the geometry modification module, the identified locations of the structure to change the mass the calculated amount and changing (318), by the geometry modification module, mass by the calculated amount at the identified locations. Changing (318) mass may include increasing the mass in some instances and decreasing the mass in others depending upon the preferred frequency for the target frequency mode.

The method of FIG. 3 also includes identifying (320) again the frequency modes of the structure. In the example of FIG. 3 identifying (320) again the frequency modes of the structure includes identifying a shifted frequency of the target frequency mode. The term 'shifted frequency' refers to the center frequency of the target frequency mode after altering a local attribute of the structure.

The method of FIG. 3 then continues by recalculating (322) the modal ratio as the quotient of the target frequency divided by the shifted frequency and determining (324) whether the modal ratio falls within a predefined range of acceptable values. If the modal ratio falls within a predefined range of acceptable values, the optimization process is complete. If the modal ratio does not fall within a predefined range of acceptable values, the method continues with a second iteration—calculating (310) an amount of mass to change in dependence upon the (newly calculated) ratio and so on.

Figure 4:
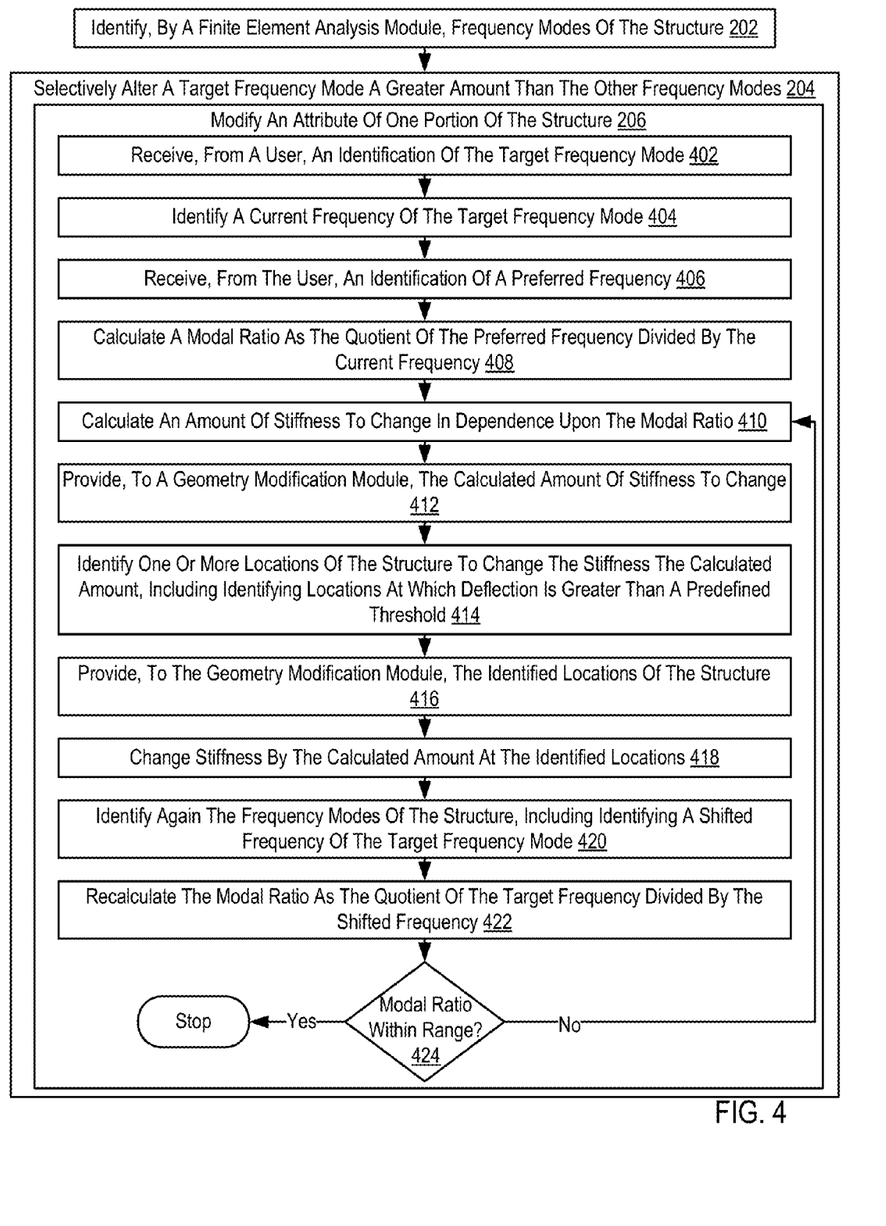
FIG. 4 sets forth a flow chart illustrating another exemplary method for selectively tuning frequency modes of a structure according to embodiments of the present invention.

For further explanation, FIG. 4 sets forth a flow chart illustrating another exemplary method for selectively tuning frequency modes of a structure according to embodiments of the present invention. The method of FIG. 4 is similar to the method of FIG. 2, including as it does, identifying (202) frequency modes of the structure and selectively altering (204) the target frequency mode, including modifying (206) a local attribute of a portion of the structure associated with the target frequency mode without modifying the attribute over the entire structure. The method of FIG. 4, however, differs from the method of FIG. 2 in that, in the method of FIG. 4, modifying (206) a local attribute of a portion of the structure associated with the target frequency mode includes a method of localized stiffness modification.

More specifically, the method of FIG. 4 includes receiving (402), from a user, an identification of the target frequency mode, identifying (404) a current frequency of the target frequency mode, receiving (406), from the user, an identification of a preferred frequency of the target frequency mode and calculating (408) a modal ratio as the quotient of the preferred frequency divided by the current frequency.

The method of FIG. 4 also includes calculating (410) an amount of stiffness to change in dependence upon the modal ratio. Calculating (410) an amount of stiffness to change in dependence upon the modal ratio may be carried out by calculating the amount as the modal ratio^3. The method of FIG. 4 also includes providing (412), to a geometry modification module, the calculated amount of stiffness to change.

The method of FIG. 4 also includes identifying (414) one or more locations of the structure to change the stiffness the calculated amount. In the method of FIG. 4, identifying (414) one or more locations of the structure to change the stiffness the calculated amount may be carried out by identifying locations at which strain is greater than a predefined threshold (such as 90% of maximum strain) when operating at the target frequency mode.

The method of FIG. 4 continues by providing (416), to the geometry modification module, the identified locations of the structure to change the stiffness the calculated amount and changing (418), by the geometry modification module, stiffness by the calculated amount at the identified locations. Once changed, the method of FIG. 4 continues by identifying (420) again the frequency modes of the structure, including identifying a shifted frequency of the target frequency mode. The method of FIG. 4 includes recalculating (422) the modal ratio as the quotient of the target frequency divided by the shifted frequency and determining (424) whether the modal ratio falls within a predefined range of acceptable values. If the modal ratio falls within the predefined range, the optimization process is complete. If the modal ratio does not fall within the predefined range, a second iteration of localized stiffness modification is carried out.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

The invention claimed is:

1. A method comprising:
   by program instructions on a computing device,
   identifying, by a finite element analysis module, a plurality of frequency modes of a structure; and
   selectively altering a target frequency mode a greater amount than the other frequency modes of the structure, including modifying a local physical attribute of a portion of the structure associated with the target frequency mode without modifying the physical attribute over the entire structure comprising:
   receiving, by the finite element analysis module, an identification of the target frequency mode;
   identifying, by the finite element analysis module, a current frequency of the target frequency mode;
   receiving, by the finite element analysis module, an identification of a preferred frequency of the target frequency mode;
   calculating, by the finite element analysis module, a modal ratio as the quotient of the preferred frequency divided by the current frequency;
   calculating, by the finite element analysis module, an amount of mass to change in dependence upon the modal ratio;
   providing, by the finite element analysis module, to a geometry modification module, the calculated amount of mass to change;

identifying, by the finite element analysis module, one or more locations of the structure to change mass by the calculated amount, including identifying locations at which deflection is greater than a predefined threshold when operating at the target frequency mode;

providing, by the finite element analysis module, to the geometry modification module, the identified locations of the structure to change the mass by the calculated amount;

changing, by the geometry modification module, mass by the calculated amount at the identified locations;

identifying, by the finite element analysis module, again the frequency modes of the structure, including identifying a shifted frequency of the target frequency mode; and recalculating, by the finite element analysis module, the modal ratio as the quotient of the target frequency divided by the shifted frequency.

2. The method of claim 1 wherein modifying the local attribute of the portion of the structure associated with the target frequency mode without modifying the physical attribute over the entire structure is preformed, iteratively, until the modal ratio falls within a predefined range of values.

3. The method of claim 1 wherein modifying the local physical attribute of the portion of the structure associated with the target frequency mode without modifying the physical attribute over the entire structure further comprises:

iteratively, until the modal ratio falls within the predefined range of values:

calculating an amount of stiffness to change in dependence upon the modal ratio;

providing, to the geometry modification module, the calculated amount of stiffness to change;

identifying one or more locations of the structure to change the stiffness by the calculated amount, including identifying locations at which strain is greater than a predefined threshold when operating at the target frequency mode;

providing, to the geometry modification module, the identified locations of the structure to change the stiffness by the calculated amount;

changing, by the geometry modification module, stiffness by the calculated amount at the identified locations;

identifying again the frequency modes of the structure, including identifying the shifted frequency of the target frequency mode; and recalculating the modal ratio as the quotient of the target frequency divided by the shifted frequency.

4. The method of claim 1 wherein:

the structure comprises one part of an apparatus comprising at least a second structure; and selectively altering a target frequency mode a greater amount than the other frequency modes of the structure further comprises selectively altering the target frequency mode a greater amount than any frequency mode of the second structure.

5. The method of claim 1 wherein the finite element analysis module comprising a plug-in to a finite element analysis application.

6. An apparatus comprising a computer processor and a computer memory operatively coupled to the computer processor, the computer memory having disposed within it computer program instructions that, when executed by the computer processor, cause the apparatus to carry out the steps of:

identifying, by a finite element analysis module, a plurality of frequency modes of a structure; and selectively altering a target frequency mode a greater amount than the other frequency modes of the structure, including modifying a local physical attribute of a portion of the structure associated with the target frequency mode without modifying the physical attribute over the entire structure comprising:

receiving, by the finite element analysis module, an identification of the target frequency mode;

identifying, by the finite element analysis module, a current frequency of the target frequency mode;

receiving, by the finite element analysis module, an identification of a preferred frequency of the target frequency mode;

calculating, by the finite element analysis module, a modal ratio as the quotient of the preferred frequency divided by the current frequency;

calculating, by the finite element analysis module, an amount of mass to change in dependence upon the modal ratio;

providing, by the finite element analysis module, to a geometry modification module, the calculated amount of mass to change;

identifying, by the finite element analysis module, one or more locations of the structure to change mass by the calculated amount, including identifying locations at which deflection is greater than a predefined threshold when operating at the target frequency mode;

providing, by the finite element analysis module, to the geometry modification module, the identified locations of the structure to change the mass by the calculated amount;

changing, by the geometry modification module, mass by the calculated amount at the identified locations;

identifying, by the finite element analysis module, again the frequency modes of the structure, including identifying a shifted frequency of the target frequency mode; and recalculating, by the finite element analysis module, the modal ratio as the quotient of the target frequency divided by the shifted frequency.

7. The apparatus of claim 6 wherein modifying the local attribute of the portion of the structure associated with the target frequency mode without modifying the attribute over the entire structure is preformed, iteratively, until the modal ratio falls within a predefined range of values.

8. The apparatus of claim 6 wherein modifying the local physical attribute of the portion of the structure associated with the target frequency mode without modifying the physical attribute over the entire structure further comprises:

iteratively, until the modal ratio falls within the predefined range of values:

calculating an amount of stiffness to change in dependence upon the modal ratio;

providing, to the geometry modification module, the calculated amount of stiffness to change;

identifying one or more locations of the structure to change the stiffness by the calculated amount, including identifying locations at which strain is greater than a predefined threshold when operating at the target frequency mode;

providing, to the geometry modification module, the identified locations of the structure to change the stiffness by the calculated amount;

changing, by the geometry modification module, stiffness by the calculated amount at the identified locations;

identifying again the frequency modes of the structure, including identifying the shifted frequency of the target frequency mode; and recalculating the modal ratio as the quotient of the target frequency divided by the shifted frequency.

9. The apparatus of claim 6 wherein:

the structure comprises one part of an apparatus comprising at least a second structure; and selectively altering a target frequency mode a greater amount than the other frequency modes of the structure further comprises selectively altering the target frequency mode a greater amount than any frequency mode of the second structure.

10. The apparatus of claim 6 wherein the finite element analysis module comprising a plug-in to a finite element analysis application.

11. A computer program product including a non-transitory computer readable medium, the computer program product comprising computer program instructions that, when executed, cause a computer to carry out the steps of:

identifying, by a finite element analysis module, a plurality of frequency modes of a structure; and selectively altering a target frequency mode a greater amount than the other frequency modes of the structure, including modifying a local physical attribute of a portion of the structure associated with the target frequency mode without modifying the physical attribute over the entire structure comprising:

receiving, by the finite element analysis module, an identification of the target frequency mode;

identifying, by the finite element analysis module, a current frequency of the target frequency mode;

receiving, by the finite element analysis module, an identification of a preferred frequency of the target frequency mode;

calculating, by the finite element analysis module, a modal ratio as the quotient of the preferred frequency divided by the current frequency;

calculating, by the finite element analysis module, an amount of mass to change in dependence upon the modal ratio;

providing, by the finite element analysis module, to a geometry modification module, the calculated amount of mass to change;

identifying, by the finite element analysis module, one or more locations of the structure to change mass by the calculated amount, including identifying locations at which deflection is greater than a predefined threshold when operating at the target frequency mode;

providing, by the finite element analysis module, to the geometry modification module, the identified locations of the structure to change the mass by the calculated amount;

changing, by the geometry modification module, mass by the calculated amount at the identified locations;

identifying, by the finite element analysis module, again the frequency modes of the structure, including identifying a shifted frequency of the target frequency mode; and recalculating, by the finite element analysis module, the modal ratio as the quotient of the target frequency divided by the shifted frequency.

12. The computer program product of claim 11 wherein modifying the local attribute of the portion of the structure associated with the target frequency mode without modifying the physical attribute over the entire structure is preformed, iteratively, until the modal ratio falls within a predefined range of values.

13. The computer program product of claim 11 wherein modifying the local physical attribute of the portion of the structure associated with the target frequency mode without modifying the physical attribute over the entire structure further comprises:

iteratively, until the modal ratio falls within the predefined range of values:

calculating an amount of stiffness to change in dependence upon the modal ratio;

providing, to the geometry modification module, the calculated amount of stiffness to change;

identifying one or more locations of the structure to change the stiffness by the calculated amount, including identifying locations at which strain is greater than a predefined threshold when operating at the target frequency mode;

providing, to the geometry modification module, the identified locations of the structure to change the stiffness by the calculated amount;

changing, by the geometry modification module, stiffness by the calculated amount at the identified locations;

identifying again the frequency modes of the structure, including identifying the shifted frequency of the target frequency mode; and recalculating the modal ratio as the quotient of the target frequency divided by the shifted frequency.

14. The computer program product of claim 11 wherein:

the structure comprises one part of an apparatus comprising at least a second structure; and selectively altering a target frequency mode a greater amount than the other frequency modes of the structure further comprises selectively altering the target frequency mode a greater amount than any frequency mode of the second structure.

15. The computer program product of claim 11 wherein a finite element analysis module comprising a plug-in to the finite element analysis application.

* * * * *